(12) United States Patent
Sung et al.

(10) Patent No.: US 10,332,587 B1
(45) Date of Patent: Jun. 25, 2019

(54) DYNAMIC RANDOM ACCESS MEMORY DEVICE

(71) Applicant: Samsung Electronics Co., Ltd., Suwon-si, Gyeonggi-do (KR)

(72) Inventors: Ki Jong Sung, Hwaseong-si (KR); Dae Sun Kim, Hwaseong-si (KR); Jin Seon Kim, Hwaseong-si (KR); In Cheol Nam, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/986,354

(22) Filed: May 22, 2018

(30) Foreign Application Priority Data

Dec. 8, 2017 (KR) ................. 10-2017-0168152

(51) Int. Cl.
| | | |
|---|---|---|
| G11C 11/24 | (2006.01) | |
| G11C 11/4094 | (2006.01) | |
| G11C 11/408 | (2006.01) | |
| G11C 11/4091 | (2006.01) | |
| G11C 11/4096 | (2006.01) | |
| G11C 11/4099 | (2006.01) | |

(52) U.S. Cl.
CPC ...... *G11C 11/4094* (2013.01); *G11C 11/4085* (2013.01); *G11C 11/4087* (2013.01); *G11C 11/4091* (2013.01); *G11C 11/4096* (2013.01); *G11C 11/4099* (2013.01)

(58) Field of Classification Search
CPC ............ G11C 11/4094; G11C 11/4087; G11C 11/4085; G11C 11/4096; G11C 11/4091; G11C 11/4099
See application file for complete search history.

(56) References Cited

U.S. PATENT DOCUMENTS

| 6,097,654 | A | * | 8/2000 | Kikuchi | .............. G11C 11/4091 257/E21.657 |
|---|---|---|---|---|---|
| 7,315,481 | B2 | | 1/2008 | Ito | |
| 7,447,088 | B2 | | 11/2008 | Yi | |
| 7,894,287 | B2 | | 2/2011 | Kim | |
| 9,064,561 | B2 | | 6/2015 | Hold | |

(Continued)

FOREIGN PATENT DOCUMENTS

KR          100866145 B1    10/2008

*Primary Examiner* — Uyen B Tran
(74) *Attorney, Agent, or Firm* — Myers Bigel, P.A.

(57) ABSTRACT

A dynamic random access memory (DRAM) device includes a memory cell array including a first sub memory cell array block including a plurality of first memory cells between a plurality of first sub word lines, and a plurality of first odd-numbered bit lines and a plurality of dummy bit lines and includes a second sub memory cell array block including a plurality of second memory cells between a plurality of second sub word lines, a plurality of second odd-numbered bit lines, and a plurality of second even-numbered bit lines. The memory cell array may be arranged to have an open bit line architecture in which the plurality of first odd-numbered bit lines and the plurality of second even-numbered bit lines form bit line pairs. When the first sub word line may be selected, a predetermined voltage may be applied to the plurality of dummy bit lines for a first predetermined period in which a charge sharing operation is performed on the plurality of first memory cells connected to the selected one of the plurality of first sub word lines.

20 Claims, 9 Drawing Sheets

(56) References Cited

U.S. PATENT DOCUMENTS

| | | |
|---|---|---|
| 9,251,912 B2 | 2/2016 | Lee et al. |
| 9,373,364 B2 | 6/2016 | Takahashi |
| 2003/0086304 A1* | 5/2003 | Park .......................... G11C 8/14 |
| | | 365/189.07 |
| 2003/0227808 A1* | 12/2003 | Sako ......................... G11C 7/06 |
| | | 365/205 |
| 2007/0104006 A1* | 5/2007 | Hwang ................. G11C 7/1078 |
| | | 365/233.17 |
| 2007/0171728 A1 | 7/2007 | Cho |
| 2010/0172193 A1 | 7/2010 | Lee |
| 2015/0357013 A1 | 12/2015 | Park et al. |

\* cited by examiner

DYNAMIC RANDOM ACCESS MEMORY DEVICE

CROSS-REFERENCE TO RELATED APPLICATION

This U.S. non-provisional patent application claims priority under 35 U.S.C. § 119 to Korean Patent Application No. 10-2017-0168152, filed on Dec. 8, 2017, in the Korean Intellectual Property Office (KIPO), the content of which is hereby incorporated herein by reference in its entirety.

BACKGROUND

1. Field

The present inventive concept relates generally to semiconductor memory devices and, more particularly, to dynamic random access memory devices.

2. Discussion of Related Art

Dynamic random access memory (DRAM) devices may have an open bit line architecture or a folded bit line architecture according to an arrangement of bit lines.

A DRAM device having an open bit line architecture may include a plurality of memory cell array blocks arranged in a bit line direction. In a plurality of memory cell array blocks extending in a bit line direction, those memory cell array blocks disposed at the ends thereof may include dummy bit lines, which are not accessed.

Generally, dummy bit lines may have a floating state to address a problem in which an excessive current may flow due to bridge defects with bit lines that are accessed. However, when a leakage current is generated in the dummy bit lines having the floating state, a threshold voltage of an access transistor of each memory cell connected to a selected word line may increase. Accordingly, when a charge sharing operation is performed between a capacitor of each of the memory cells connected to the selected word line and a corresponding bit line, the access transistor may not be completely turned on, which may result in an operation failure.

SUMMARY

According to embodiments of the present inventive concept, a dynamic random access memory (DRAM) device may reduce failures caused during operation due to leakage current generated in dummy bit lines.

According to some embodiments of the present inventive concept, a DRAM device may include a memory cell array including a first sub memory cell array block including a plurality of first memory cells between a plurality of first sub word lines, a plurality of first odd-numbered bit lines and a plurality of dummy bit lines and includes a second sub memory cell array block including a plurality of second memory cells between a plurality of second sub word lines, a plurality of second odd-numbered bit lines, and a plurality of second even-numbered bit lines. The memory cell array has an open bit line architecture in which the plurality of first odd-numbered bit lines and the plurality of second even-numbered bit lines form bit line pairs. The first sub word line may be selected and a predetermined voltage may be applied to the plurality of dummy bit lines for a first predetermined period in which a charge sharing operation is performed on the first memory cells connected to the selected one of the plurality of first sub word lines.

According to embodiments of the present inventive concept, a DRAM device may include a memory cell array including a plurality of X memory cell array blocks, wherein each of the plurality of X memory cell array blocks includes a plurality of sub memory cell array blocks, each of the plurality of sub memory cell array blocks includes a plurality of memory cells arranged between a plurality of sub word lines, a plurality of odd-numbered bit lines, and a plurality of even-numbered bit lines, the memory cell array may have an open bit line architecture in which even-numbered bit lines of a first block of the plurality of sub memory cell array blocks and odd-numbered bit lines of a second block of the plurality of sub memory cell array blocks, which are arranged adjacent to each other are arranged to form bit line pairs, and the even-numbered bit lines or the odd-numbered bit lines of the sub memory cell array blocks included in the first and second X memory cell array blocks arranged at both ends of the plurality of X memory cell array blocks are dummy bit lines. One sub word line of the sub memory cell array blocks included in the first and second X memory cell array blocks may be selected, and a predetermined voltage may be applied to the dummy bit lines in the sub memory cell array block including the selected sub word line for a first predetermined period in which a charge sharing operation is performed on the memory cells of the plurality of memory cells connected to the selected sub word line.

According to embodiments of the present inventive concept, a DRAM device may include a memory cell array including a plurality of memory cell array blocks, wherein each of the plurality of memory cell array blocks includes a plurality of sub memory cell array blocks, each of the plurality of sub memory cell array blocks includes a plurality of memory cells between a plurality of sub word lines, a plurality of even-numbered bit lines, and a plurality of odd-numbered bit lines, the memory cell array has an open bit line architecture in which even-numbered bit lines of a first block of the plurality of sub memory cell array blocks and odd-numbered bit lines of a second block of the plurality of sub memory cell array blocks, which are adjacent to each other, form bit line pairs, and the even-numbered bit lines or the odd-numbered bit lines of the first and second memory cell array blocks arranged at both ends of the plurality of memory cell array blocks are dummy bit lines. One sub word line of the first and second memory cell array blocks may be selected, and a predetermined voltage may be applied to the dummy bit lines in the memo cell array block including the selected sub word line for a first predetermined period in which a charge sharing operation is performed on the memory cells of the plurality of memory cells connected to the selected sub word line.

BRIEF DESCRIPTION OF THE DRAWINGS

The above and other objects, features and advantages of the present inventive concept will become more apparent to those of ordinary skill in the art by describing example embodiments thereof in detail with reference to the accompanying drawings, in which.

DETAILED DESCRIPTION

Hereinafter, dynamic random access memory (DRAM) devices according to example embodiments of the present inventive concept will be described with reference to the accompanying drawings.

Figure 1:
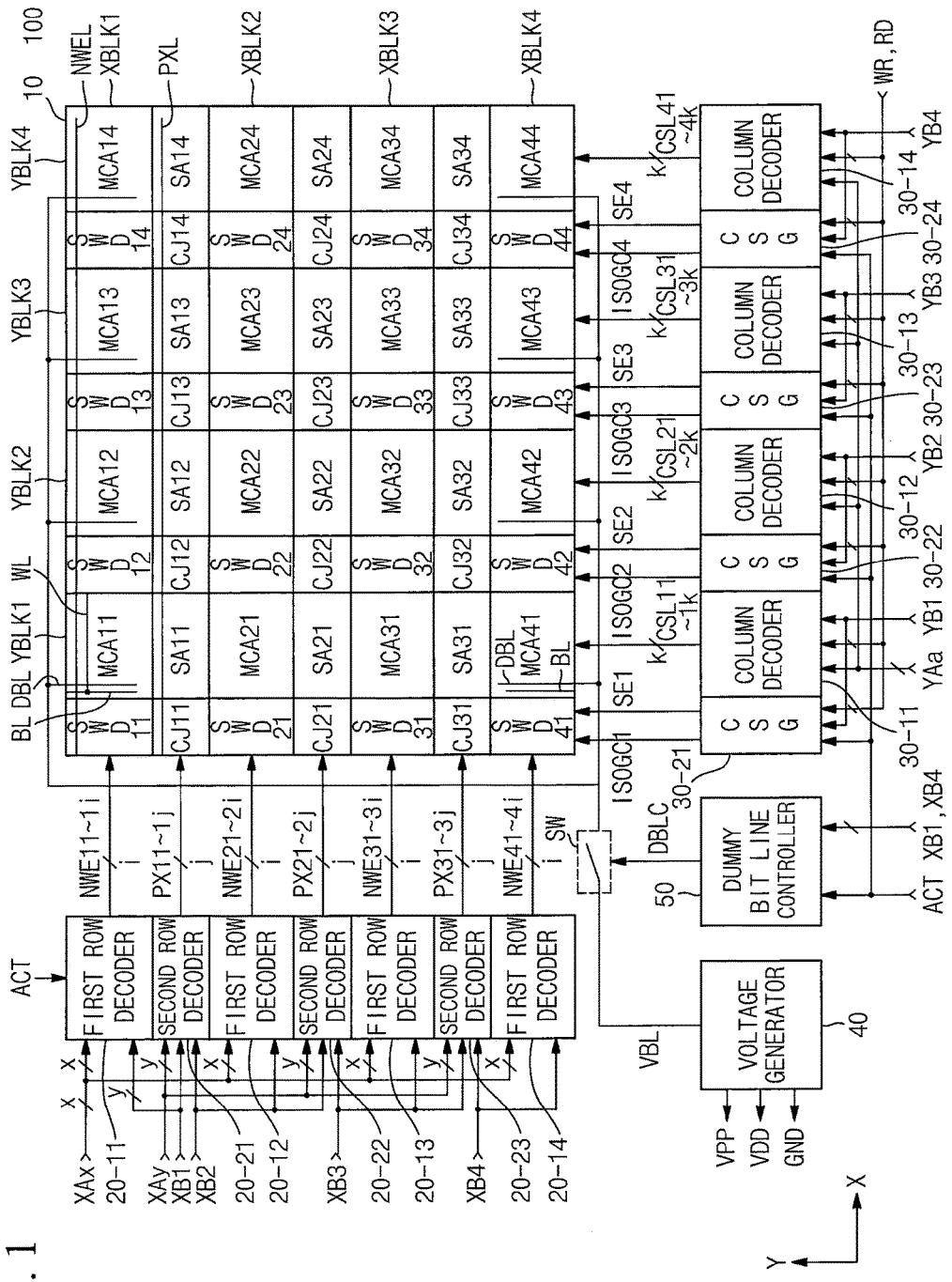
FIGS. 1 to 3 are diagrams that illustrate arrangements and configurations of dynamic random access memory (DRAM) devices according to example embodiments of the present inventive concept.

FIG. 1 is a diagram that illustrates an arrangement and a configuration of a DRAM device according to an example embodiment of the present inventive concept.

Referring to FIG. 1, a DRAM device 100 may include a memory cell array 10, first row decoders 20-11 to 20-14, second row decoders 20-21 to 20-23, column decoders 30-11 to 30-14, control signal generators (CSG) 30-21 to 30-24, a voltage generator 40, a dummy bit line controller 50, and a switch SW.

The memory cell array 10 may include four X memory cell array blocks XBLK1 to XBLK4 arranged in a bit line direction Y. The four X memory cell array blocks XBLK1, XBLK2, XBLK3, and XBLK4 may include four sub memory cell array blocks MCA11 to MCA14, MCA21 to MCA24, MCA31 to MCA34, and MCA41 to MCA44, respectively. The memory cell array 10 may include four Y memory cell array blocks YBLK1 to YBLK4 arranged in a word line direction X. The four Y memory cell array blocks YBLK1, YBLK2, YBLK3, and YBLK4 may include the four sub memory cell array blocks MCA11 to MCA41, MCA12 to MCA42, MCA13 to MCA43, and MCA14 to MCA44, respectively. The memory cell array 10 may include sense amplification regions SA11 to SA34 arranged between the sub memory cell array blocks MCA11 to MCA41, MCA12 to MCA42, MCA13 to MCA43, and MCA14 to MCA44 in the bit line direction Y. Sub word line driver regions SWD11 to SWD44 are arranged on left sides of the sub memory cell array blocks MCA11 to MCA41 included in the Y memory cell array block YBLK1 and are arranged between the sub memory cell array blocks MCA11 to MCA14, MCA21 to MCA24, MCA31 to MCA34, and MCA41 to MCA44 in the word line direction X. Conjunction regions CJ11 to CJ34 are arranged in regions in which the sub word line driver regions SWD11 to SWD44 and the sense amplification regions SA11 to SA34 intersect with each other. Each of the sub memory cell arrays MCA11 to MCA44 may include a plurality of memory cells (not illustrated) between sub word lines WL and bit lines BL. The sub word lines WL may be arranged in the word line direction X and the bit lines BL may be arranged in the bit line direction Y. The sub memory cell array blocks MCA11 to MCA14 and MCA41 to MCA44 included in each of memory cell array blocks XBLK1 and XBK4 may include the bit lines BL, which are accessed, and dummy bit lines DBL, which are not accessed. The dummy bit lines DBL may be arranged in the same direction as the bit lines BL.

Each of the first row decoders 20-11, 20-12, 20-13, and 20-14 may decode an x-bit row address XAx of a row address input to the DRAM 100 in response to an active command ACT and a corresponding block selection signal among X block selection signals XB1, XB2, XB3, and XB4, and generate corresponding i main word line selection signals NWE11 to NWE1$i$, NWE21 to NWE2$i$, NWE31 to NWE3$i$, and NWE41 to NWE4$i$, respectively. Each of the second row decoders 20-21, 20-22, and 20-23 may generate corresponding j sub word line selection signals PX11 to PX1$j$, PX21 to PX2$j$, and PX31 to PX3$j$, respectively, in response to the active command ACT and a corresponding block selection signal among the X block selection signals (XB1 and XB2), (XB2 and XB3), and (XB3 and XB4), respectively. Each of the X block selection signals XB1 to XB4 may be generated by decoding a 2-bit row address based on the row address. Lines NWEL and PXL, the main word line selection signals NWE11 to NWE1$i$, NWE21 to NWE2$i$, NWE31 to NWE3$i$, and NWE41 to NWE4$i$, and the sub word line selection signals PX11 to PX1$j$, PX21 to PX2$j$, and PX31 to PX3$j$ may be arranged in the word line direction X. Each of the column decoders 30-11, 30-12, 30-13, and 30-14 may decode an a-bit column address YAa based on a column address input from the outside in response to a write command WR or a read command RD and a corresponding block selection signal among Y block selection signals YB1, YB2, YB3, and YB4, and generate corresponding k column selection signals CSL11 to CSL1$k$, CSL21 to CSL2$k$, CSL31 to CSL3$k$, or CSL41 to CSL4$k$. Each of the Y block selection signals YB1 to YB4 may be generated by decoding a 2-bit column address based on the column addresses. Each of the control signal generators 30-21, 30-22, 30-23, and 30-24 may generate a corresponding isolation gate control signal ISOGC1, ISOGC2, ISOGC3, or ISOGC4 in response to the active command ACT and the corresponding Y block selection signal YB1, YB2, YB3, or YB4, and generate a corresponding sense amplifier control signal SE1, SE2, SE3, or SE4 in response to the write command WR or the read command RD and the corresponding Y block selection signal YB1, YB2, YB3, or YB4. The voltage generator 40 may generate a precharge voltage VBL, a high voltage VPP, a power voltage VDD, and a ground voltage GND. The high voltage VPP may be used as a voltage for activating the sub word lines WL, the power voltage VDD and the ground voltage GND may be used as a sense amplification voltage pair for sense amplifiers (not illustrated) included in the sense amplification regions SA11~SA34, and the precharge voltage VBL may be used as a voltage for precharging the bit lines BL, and, in some embodiments, may be VDD/2. The dummy bit line controller 50 may generate a dummy bit line control signal DBLC, which is activated when one sub word line WL is selected in response to the active command ACT and the X block selection signal XB1 or XB4, and is deactivated after being activated for a first predetermined period in which a charge sharing operation is performed on a plurality of memory cells connected to the selected sub word line WL or is deactivated after being further activated for a second predetermined period. The switch SW may be turned on in response to the dummy bit line control signal DBLC, and may apply the precharge voltage VBL to the dummy bit lines DBL arranged in the sub memory cell array blocks MCA11 to MCA14 and MCA41 to MCA44 included in the memory cell array blocks XBLK1 and XBLK4.

In FIG. 1, the main word line NWEL, the sub word line selection signal line PXL, the sub word lines WL, the bit lines BL, and the dummy bit lines DBL are illustrated as representative of one or more lines of the memory cell array 10.

Figure 2:
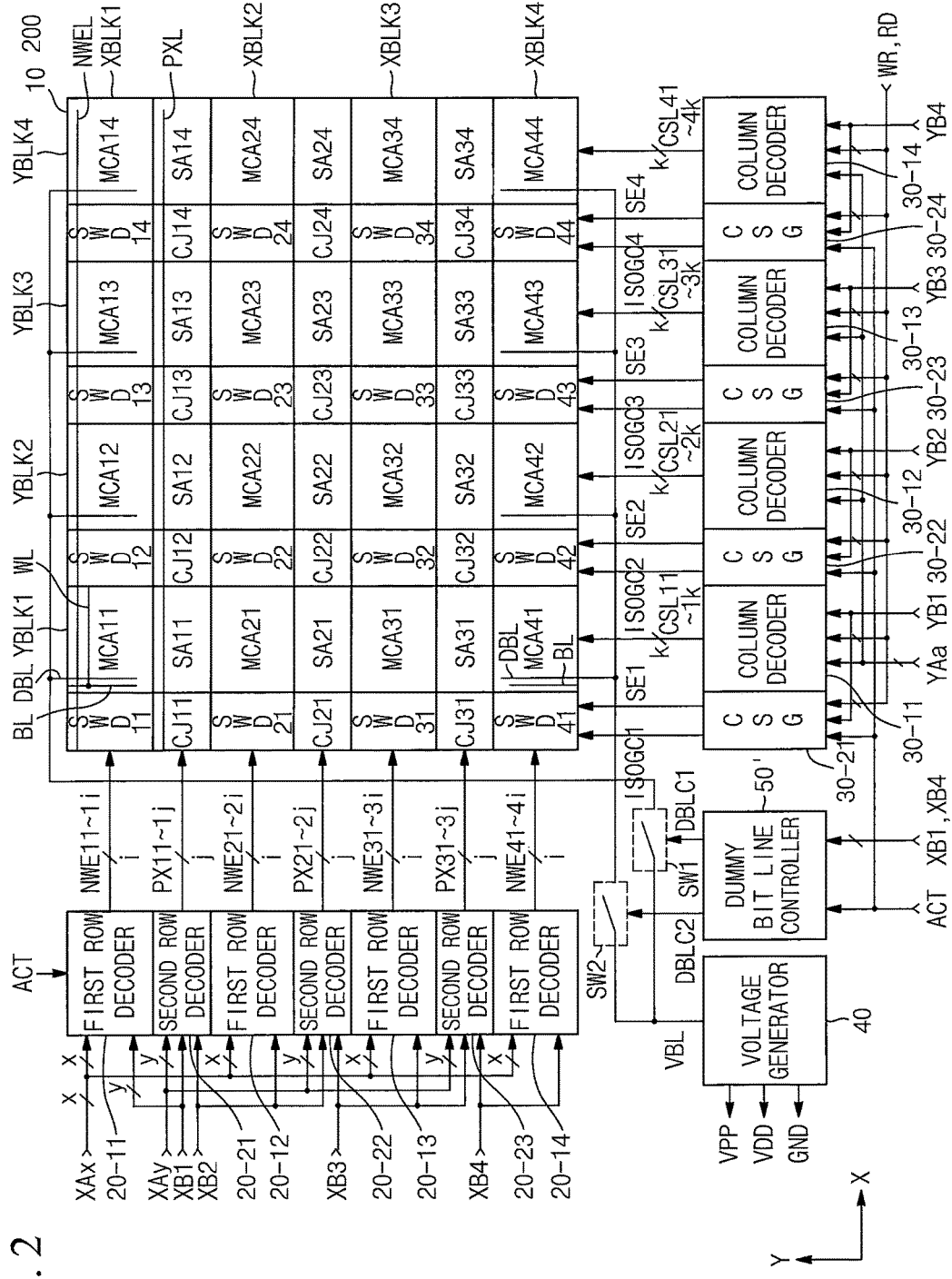

FIG. 2 is a diagram that illustrates an arrangement and a configuration of a DRAM device according to example embodiments of the present inventive concept. A DRAM device 200 may have the same configuration as the DRAM device 100 illustrated in FIG. 1 except that the dummy bit line controller 50 is replaced by a dummy bit line controller 50' and the switch SW is replaced by switches SW1 and SW2. Hereinafter, only the replaced components will be described.

In FIG. 2, the dummy bit line controller 50' may generate a first dummy bit line control signal DBLC1 in response to the active command ACT and the X block selection signal XB1, and generate a second dummy bit line control signal DBLC2 in response to the active command ACT and the X block selection signal XB4. The dummy bit line controller 50' may generate the first dummy bit line control signal DBLC1, which is activated when one sub word line of the sub word lines WL in the memory cell array block XBLK1 is selected, and is deactivated after being activated for a first predetermined period in which a charge sharing operation is performed on memory cells (not illustrated) connected to the selected sub word line or is deactivated after being further activated for a second predetermined period. Further, the dummy bit line controller 50' may generate the second dummy bit line control signal DBLC2, which is activated when one sub word line of the sub word lines WL in the memory cell array block XBLK4 is selected, and is deactivated when a charge sharing operation is performed on memory cells (not illustrated) connected to the selected sub word line is completed or is deactivated after being further activated for the second predetermined period. The switch SW1 may be turned on in response to the first dummy bit line control signal DBLC1, and may apply the precharge voltage VBL to the dummy bit lines DBL included in the memory cell array block XBLK1. The switch SW2 may be turned on in response to the second dummy bit line control signal DBLC2, and may apply the precharge voltage VBL to the dummy bit lines DBL included in the memory cell array block XBLK4.

Figure 3:
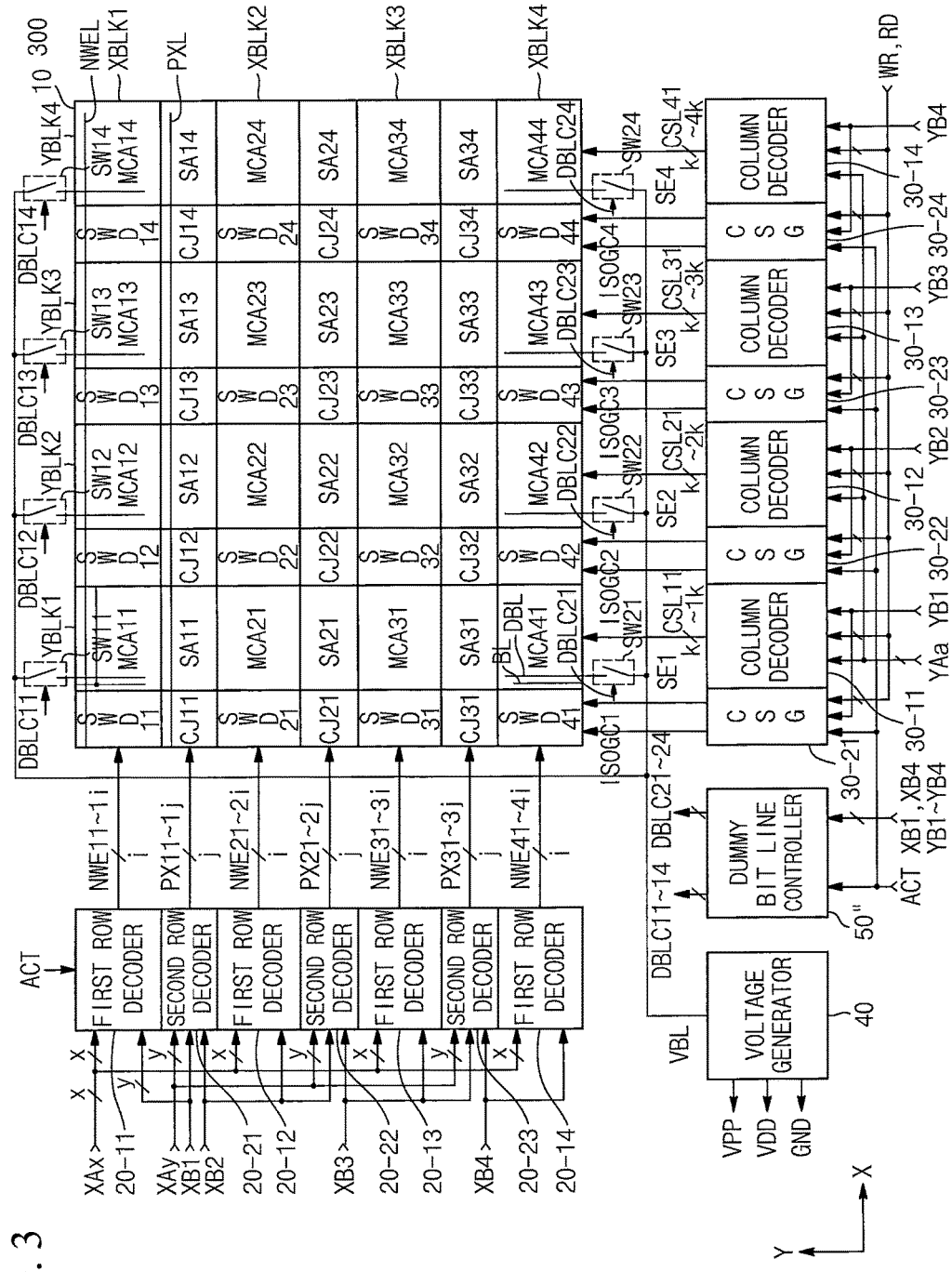

FIG. 3 is a diagram that illustrates an arrangement and a configuration of a DRAM device according to example embodiments of the present inventive concept. A DRAM device 300 may have the same configuration as the DRAM device 100 illustrated in FIG. 1 except that the dummy bit line controller 50 is replaced by a dummy bit line controller 50" and the switch SW is replaced by switches SW11 to SW14 and SW21 to SW24.

The dummy bit line controller 50" illustrated in FIG. 3 may generate a first dummy bit line control signal DBLC11 in response to the active command ACT, the X block selection signal XB1, and the Y block selection signal YB1, a second dummy bit line control signal DBLC12 in response to the active command ACT, the X block selection signal XB1, and the Y block selection signal YB2, a third dummy bit line control signal DBLC13 in response to the active command ACT, the X block selection signal XB1, and the Y block selection signal YB3, and a fourth dummy bit line control signal DBLC14 in response to the active command ACT, the X block selection signal XB1, and the Y block selection signal YB4. Further, the dummy bit line controller 50" may generate a fifth dummy bit line control signal DBLC21 in response to the active command ACT, the X block selection signal XB4, and the Y block selection signal YB1, a sixth dummy bit line control signal DBLC22 in response to the active command ACT, the X block selection signal XB4, and the Y block selection signal YB2, a seventh dummy bit line control signal DBLC23 in response to the active command ACT, the X block selection signal XB4, and the Y block selection signal YB3, and an eighth dummy bit line control signal DBLC24 in response to the active command ACT, the X block selection signal XB4, and the Y block selection signal YB4. The dummy bit line controller 50" may generate first to eighth dummy bit line control signals DBLC11 to DBLC14 and DBLC21 to DBLC24, which are activated when one sub word line of the sub word lines WL in each of the sub memory cell array blocks MCA11 to MCA14 and MCA41 to MCA44 included in the memory cell array blocks XBLK1 and XBLK4 is selected, and are deactivated after being activated for a first predetermined period in which a charge sharing operation is performed on memory cells (not illustrated) connected to the selected sub word line or are deactivated after being further activated for a second predetermined period. The switches SW11 to SW14 and SW21 to SW24 may be turned on in response to the first to eighth dummy bit line control signals DBLC11 to DBLC14 and DBLC21 to DBLC24, respectively, and apply the precharge voltage VBL to the dummy bit lines DBL included in the sub memory cell array blocks, respectively.

Figure 4:
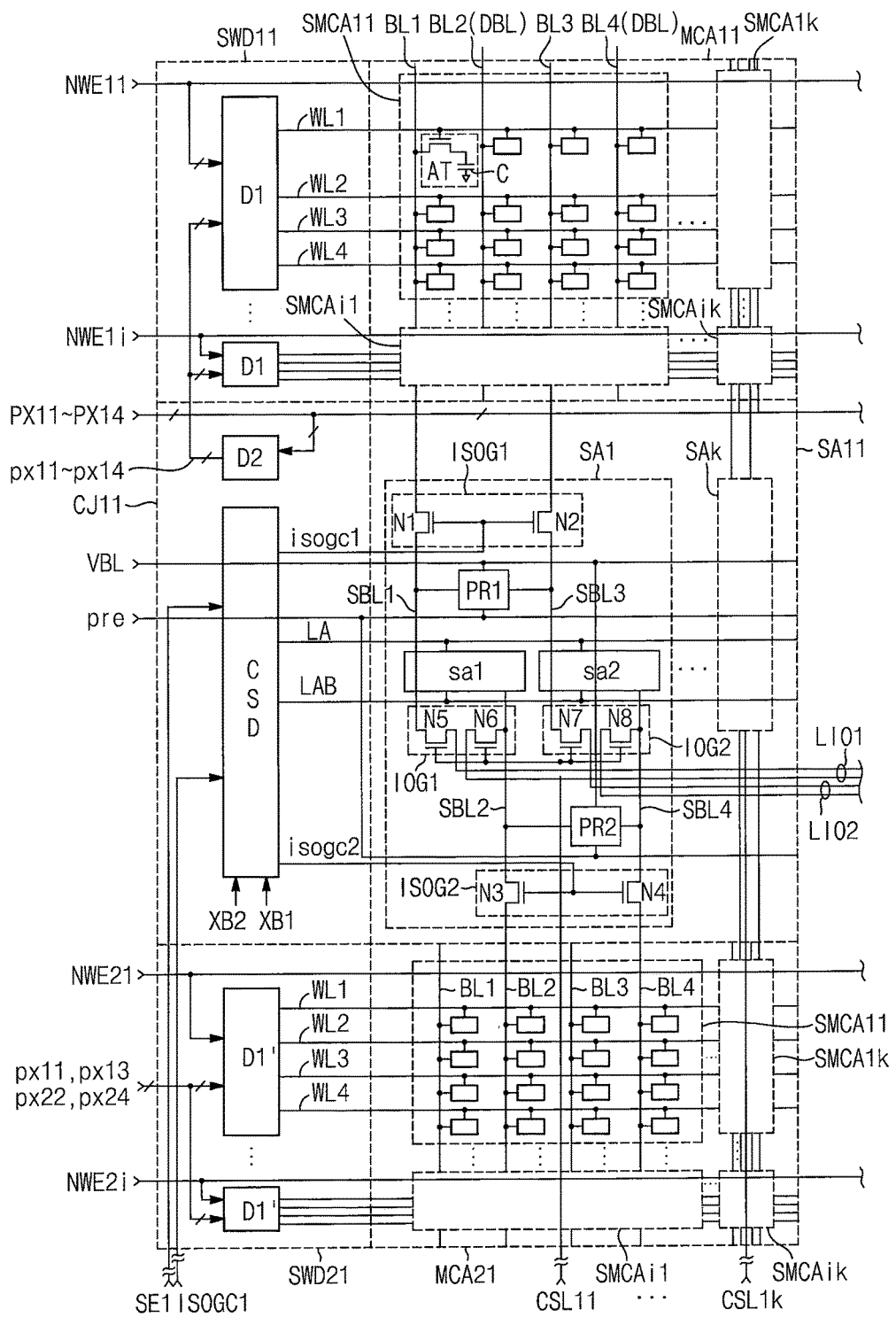
FIG. 4 is a diagram that illustrates a detailed configuration of a part of a memory cell array according to example embodiments of the present inventive concept.

FIG. 4 is a diagram that illustrates a detailed configuration of a part of the memory cell array 10 according to example embodiments of the present inventive concept. The memory cell array 10 may have an open bit line architecture.

In FIG. 4, each of sub memory cell array blocks MCA11 and MCA21 may include ik sub blocks SMCA11 to SMCAik. Each of the sub blocks SMCA11 to SMCAik may include sixteen memory cells MC connected between each of four sub word lines WL1 to WL4 and each of four odd-numbered and even-numbered bit lines BL1 to BL4. The even-numbered bit lines BL2 and BL4 in the sub memory cell array block MCA11 may be dummy bit lines DBL. The dummy bit lines DBL may be connected as illustrated in each of FIGS. 1, 2, and 3. Each of the memory cells MC may include an access transistor AT connected between the sub word line and the odd-numbered or the even-numbered bit line and a capacitor C connected between the access transistor AT and a voltage (e.g., a ground voltage). The memory cell array 10 may have an open bit line architecture in which each of the odd-numbered bit lines BL1 and BL3 in the sub memory cell array block MCA11 and each of the even-numbered bit lines BL2 and BL4 in the sub memory cell array block MCA21 form bit line pairs. The sub word line driver region SWD11 may include sub word line drivers D1. Each of the sub word line drivers D1 may drive sub word line drive selection signals px11, px12, px13, and px14 generated from the conjunction region CJ11 in response to the corresponding main word line selection signal NWE11, . . . , or NWE1$i$, and select four sub word lines WL1, WL2, WL3, and WL4 in the sub memory cell array block MCA11. The sub word line driver region SWD21 may include sub word line drivers D1'. Each of the sub word line drivers D1' may drive the sub word line drive selection signals px11 and px13 generated from the conjunction region CJ11 and sub word line drive selection signals px22 and px24 generated from the conjunction region CJ12 (not illustrated) in response to the corresponding main word line selection signal NWE21, . . . , or NWE2$i$, and select four sub word lines WL1, WL2, WL3, and WL4 in the memory cell array block MCA21. Each of the sub word line driver regions in the memory cell array 10 may be used for a memory cell array block adjacent to a right side thereof in the word line direction X.

The conjunction region CJ11 may include a sub word line selection signal driver D2 and a control signal driver CSD. The sub word line selection signal driver D2 may generate the sub word line selection signals PX11 to PX14 in response to the Y block selection signal YB1, and generate sub word line drive selection signals px11 to px14. The control signal driver CSD may generate first and second bit line isolation gate drive control signals isogc1 and isogc2 in response to the X block selection signal XB1 or XB2 and the bit line isolation gate control signal ISOGC1, and generate a sense amplification voltage pair LA and LAB in response to the X block selection signal XB1 or XB2 and the sense amplifier control signal SE1. Each of the conjunction regions in the memory cell array 10 may be used for a sub word line region adjacent to an upper and/or lower portion thereof in the bit line direction Y, and be used for a sense amplification region adjacent to a right side thereof in the word line direction X.

The sense amplification region SA11 may include k sense amplification circuits SA1 to SAk, and each of the k sense amplification circuits SA1 to SAk may include precharge circuits PR1 and PR2, sense amplifiers sa1 and sa2, first and second bit line isolation gates ISOG1 and ISOG2, and input and output gates IOG1 and IOG2. The precharge circuits P1 and P2 may perform a precharge operation in which the odd-numbered bit lines BL1 and BL3 included in the sub memory cell array block MCA11, the even-numbered bit lines BL2 and BL4 included in the sub memory cell array block MCA21, and the sense bit lines SBL1 to SBL4 included in the sense amplification region SA11 are precharged with the precharge voltage VBL in response to a precharge control signal pre. The precharge operation may be an operation in which all of the bit lines and all of the sense bit lines in the memory cell array 10 are simultaneously precharged with the precharge voltage VBL. The sense amplifiers sa1 and sa2 in the sense amplification circuits SA1 to SAk included in the sense amplification region SA11 may amplify data of the odd-numbered sense bit lines SBL1 and SBL3 connected to the odd-numbered bit lines BL1 and BL3 of the sub memory cell array block MCA11 and data of the even-numbered sense bit lines SBL2 and SBL4 connected to the even-numbered bit lines BL2 and BL4 of the sub memory cell array block MCA21 in response to the sense amplification voltage pair LA and LAB. The first bit line isolation gate ISOG1 of each of the sense amplification circuits SA1 to SAk included in the sense amplification region SA11 may include N-type metal-oxide-semiconductor (NMOS) transistors N1 and N2, which are turned on in response to the first bit line isolation gate drive control signal isogc1 and may connect the odd-numbered bit lines BL1 and BL3 of the memory cell amplifier block MCA11 to the odd-numbered sense bit lines SBL1 and SBL3 of the sense amplification region SA11. The second bit line isolation gate ISOG2 of each of the sense amplification circuits SA1 to SAk included in the sense amplification region SA11 may include NMOS transistors N3 and N4, which are turned on in response to the second bit line isolation gate drive control signal isogc2 and may connect the even-numbered bit lines BL2 and BL4 of the sub memory cell array block MCA21 to the even-numbered sense bit lines SBL2 and SBL4 of and the sense amplification region SA11. The input and output gate IOG1 of each of the sense amplification circuits SA1 to SAk included in the sense amplification region SA11 may include NMOS transistors N5 and N6, which are turned on in response to the corresponding column selection signal CSL11, . . . , or CSL1$k$, and may connect the sense bit lines SBL1 and SBL2 to an input and output line pair LIO1. The input and output gate IOG2 of each of the sense amplification circuits SA1 to SAk included in the sense amplification region SA11 may include NMOS transistors N7 and N8, which are turned on in response to the corresponding column selection signal CSL11, . . . , or CSL1$k$, and may connect the sense bit lines SBL3 and SBL4 to an input and output line pair LIO2. The components in the sense amplification region SA11 may be used for the memory cell array blocks MCA11 and MCA21 adjacent to each other in the bit line direction Y, and the components in the sense amplification region SA21 may be used for the memory cell array blocks MCA21 and MCA31 adjacent to each other in the bit line direction Y. That is, each of the sense amplification regions in the memory cell array 10 may be used for the memory cell array blocks adjacent to each other in the bit line direction Y.

Figure 5:
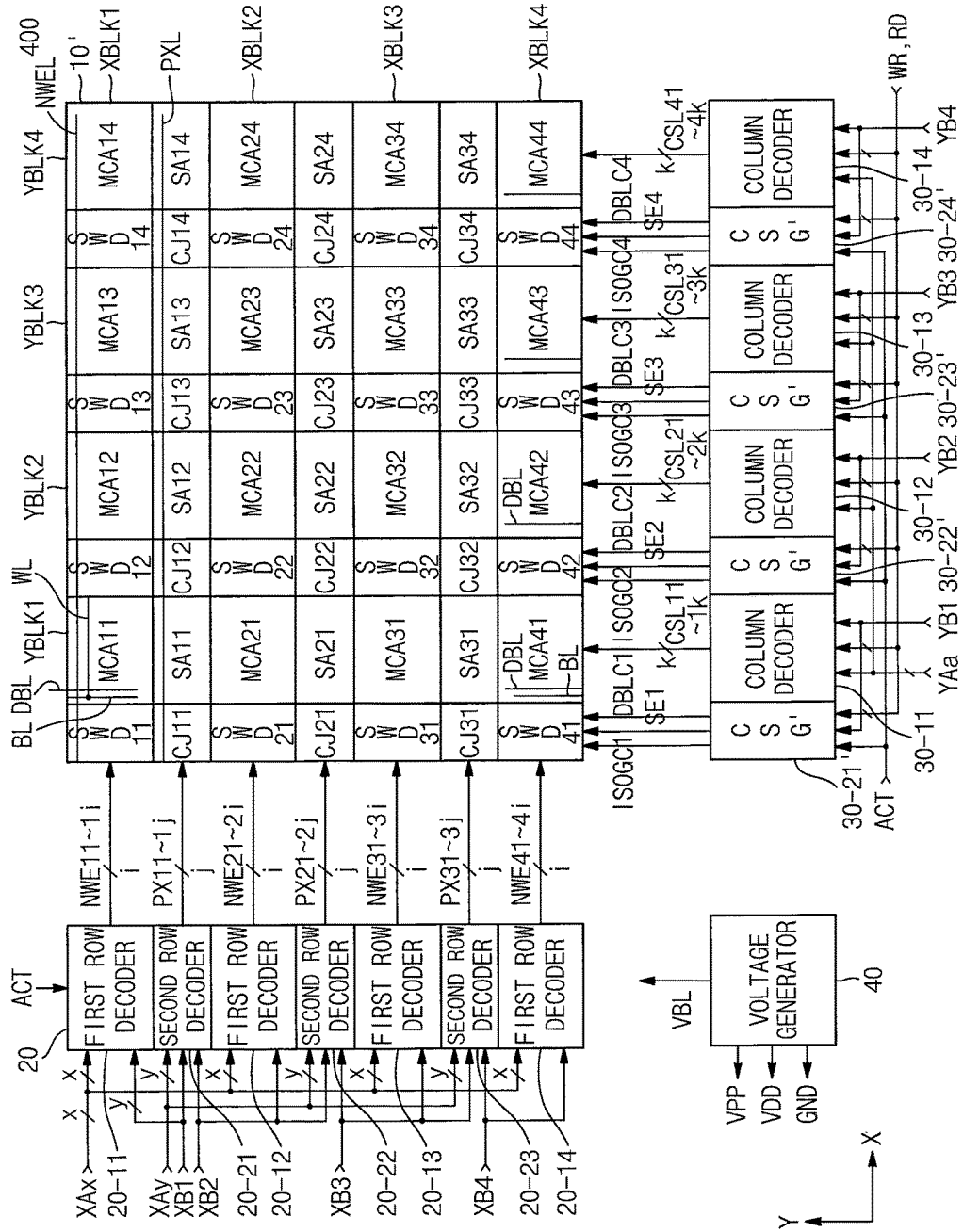
FIG. 5 is a diagram that illustrates an arrangement and a configuration of a DRAM device according to example embodiments of the present inventive concept.

FIG. 5 is a diagram that illustrates an arrangement and a configuration of a DRAM device according to example embodiments of the present inventive concept. A DRAM device 400 may have the same configuration as the DRAM device 100 illustrated in FIG. 1 except that the dummy bit line controller 50 and the switch SW are removed, the memory cell array 10 is replaced by a memory cell array 10', and the control signal generators 30-21 to 30-24 are replaced by control signal generators 30-21' to 30-24', respectively.

Functionality of each of the components having the same reference numeral as the DRAM device 100 illustrated in FIG. 1, among the components of the DRAM device 400 illustrated in FIG. 5, may be understood with reference to the description of FIG. 1. Hereinafter, functions of each of the control signal generators (CSG') 30-21' to 30-24', which are the replaced components, among the memory cell array 10' and the control signal generators 30-21' to 30-24' will be described, and the configuration of the memory cell array 10' will be described below.

Each of the control signal generators 30-21', 30-22', 30-23', and 30-24' may generate a corresponding isolation gate control signal ISOGC1, ISOGC2, ISOGC3, or ISOGC4 in response to the active command ACT and the corresponding Y block selection signal YB1, YB2, YB3, or YB4, and generate a corresponding sense amplifier control signal SE1, SE2, SE3, or SE4 in response to the write command WR or the read command RD and the corresponding Y block selection signal YB1, YB2, YB3, or YB4. Each of the control signal generators 30-21', 30-22', 30-23', and 30-24' may generate a corresponding dummy bit line control signal DBLC1, DBLC2, DBLC3, or DBLC4 in response to the active command ACT, the corresponding Y block selection signal YB1, YB2, YB3, or YB4, and the X block selection signal XB1 or XB4.

Figure 6:
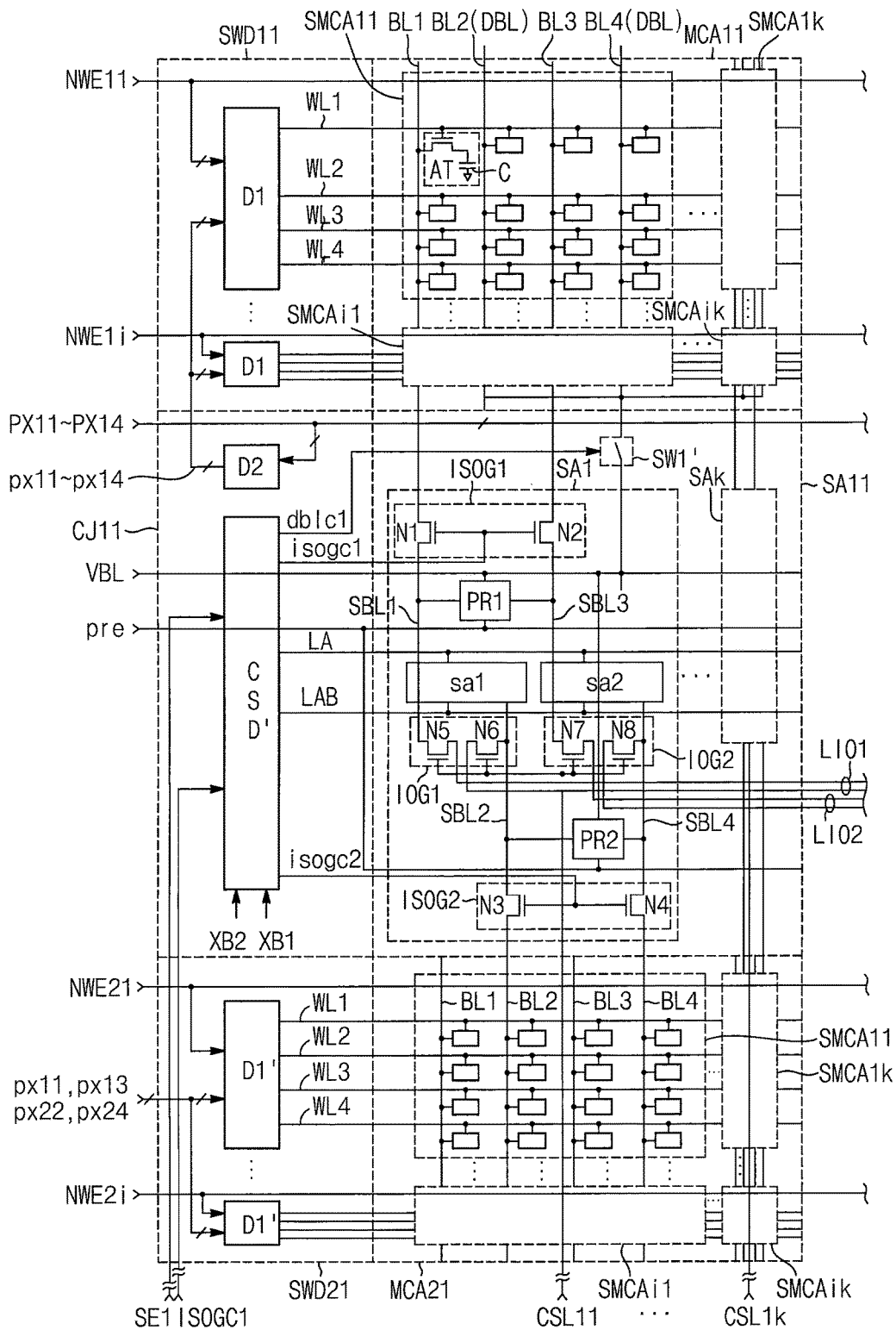
FIG. 6 is a diagram that illustrates a detailed configuration of a part of a memory cell array according to example embodiments of the present inventive concept.

FIG. 6 is a diagram that illustrates a detailed configuration of a part of the memory cell array 10' according to example embodiments of the present inventive concept. The memory cell array 10' illustrated in FIG. 6 may have the same configuration as the memory cell array 10 illustrated in FIG. 4 except that the control signal driver CSD in the conjunction region CJ11 is replaced by a control signal driver CSD' and a switch SW1' is added in the sense amplification region SA11.

Functionality of each component of the memory cell array 10' illustrated in FIG. 6 may be understood with reference to the components of the memory cell array 10 illustrated in FIG. 4. Hereinafter, functions of the replaced and added components will be described.

Unlike the control signal driver CSD illustrated in FIG. 4, the control signal driver CSD' in the conjunction region CJ11 may further generate a dummy bit line drive control signal dblc1 in response to the X block selection signal XB1 and the dummy bit line control signal DBLC1. The switch SW1' in the sense amplification region SA11 may be turned on in response to the dummy bit line drive control signal dblc1, and may apply the precharge voltage VBL to the even-numbered bit lines BL2 (DBL) and BL4 (DBL) of the sub memory cell array block MCA11. Although not illustrated, the control signal driver CSD' in each of the conjunction regions CJ12, CJ13, and CJ14 may generate a corresponding dummy bit line drive control signal dblc2, dblc3, or dblc4 in response to the X block selection signal XB1 and the corresponding dummy bit line control signal DBLC2, DBLC3, or DBLC4. Further, the switch SW1' in each of the sense amplification regions SA12, SA13, and SA14 may be turned on in response to the corresponding dummy bit line drive control signal dblc2, dblc3, or dblc4, and may apply the precharge voltage VBL to the even-numbered bit lines BL2 (DBL) and BL4 (DBL) in the corresponding sub memory cell array block MCA12, MCA13, or MCA14.

Figure 7A:
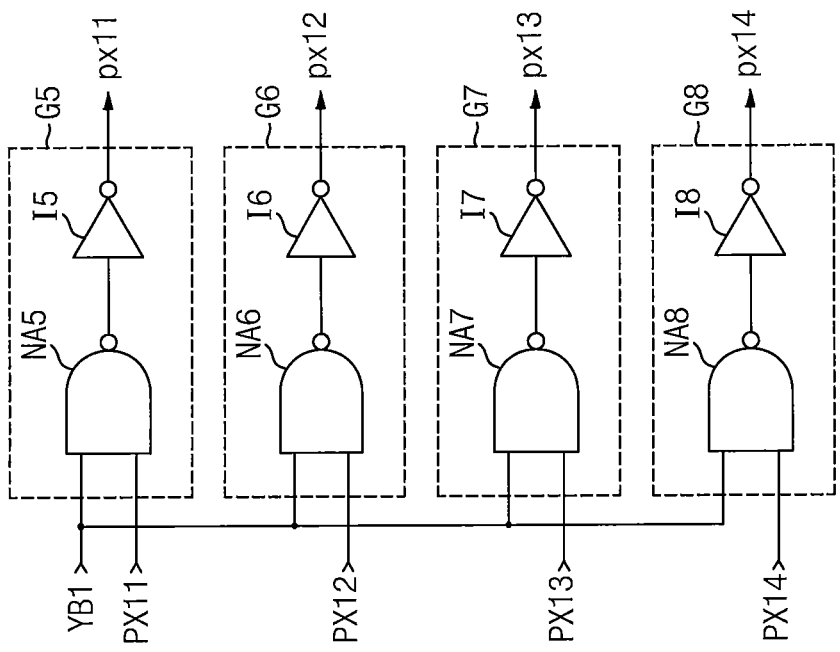
FIGS. 7A and 7B are diagrams that illustrate configurations of a sub word line driver and a sub word line selection signal driver, respectively, according to example embodiments of the present inventive concept.

FIG. 7A is a diagram that illustrates a configuration of the sub word line driver D1 illustrated in each of FIGS. 4 and 6 according to example embodiments of the present inventive concept. The sub word line driver D1 may include first to fourth logic gates G1 to G4, and the first to fourth logic gates G1 to G4 may respectively include NAND gates NA1 to NA4 and inverters I1 to I4.

In FIG. 7A, each of the first to fourth logic gates G1 to G4 may perform a logical AND operation on the main word line selection signal NWE11 and the corresponding sub word line drive selection signal px11, px12, px13, or px14, and may select the corresponding sub word line WL1, WL2, WL3, or WL4.

Figure 7B:
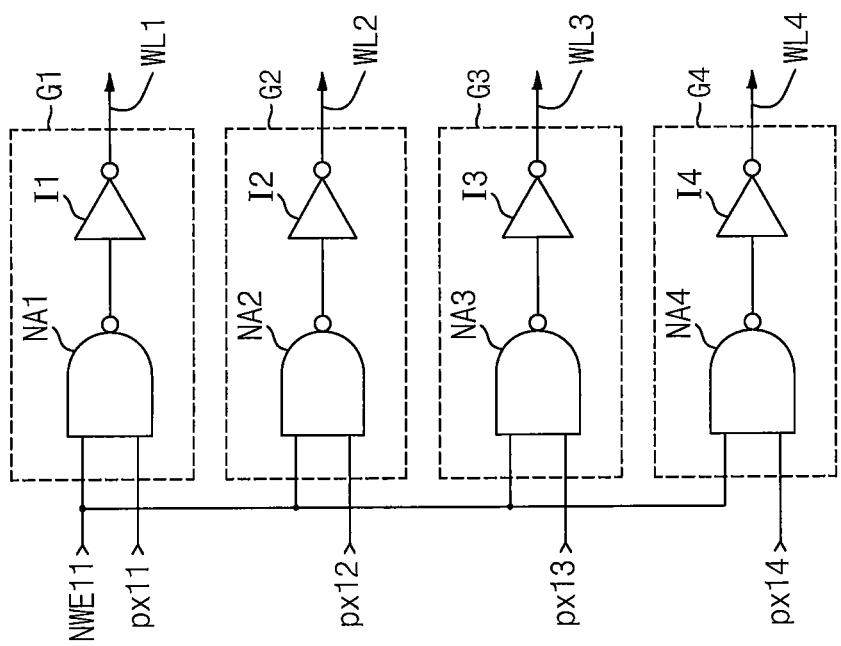

FIG. 7B is a diagram that illustrates a configuration of the sub word line selection signal driver D2 illustrated in each of FIGS. 4 and 6 according to example embodiments of the present inventive concept. The sub word line selection signal driver D2 may include fifth to eighth logic gates G5 to G8, and the fifth to eighth logic gates G5 to G8 may respectively include NAND gates NA5 to NA8 and inverters I5 to I8.

In FIG. 7B, each of the fifth to eighth logic gates G5 to G8 may perform a logical AND operation of the Y block selection signal YB1 and the corresponding sub word line selection signal PX11, PX12, PX13, or PX14, and may generate the corresponding sub word line drive selection signal px11, px12, px13, or px14.

Figure 8B:
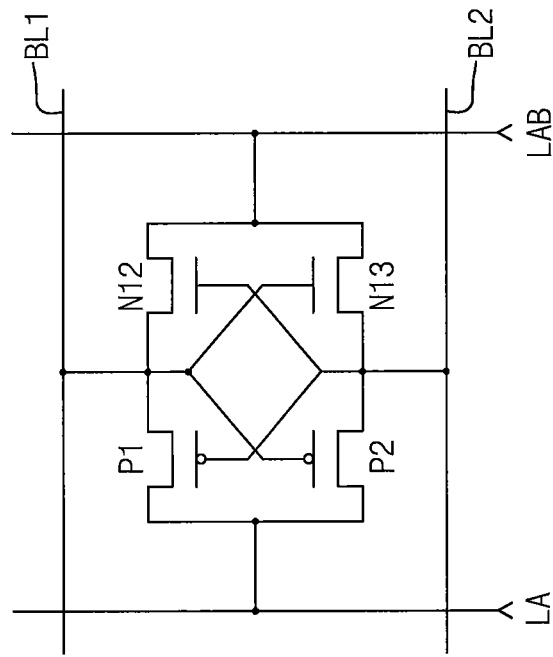
FIGS. 8A and 8B are diagrams that illustrate configurations of a precharge circuit and a sense amplifier, respectively, according to example embodiments of the present inventive concept.
Figure 8A:
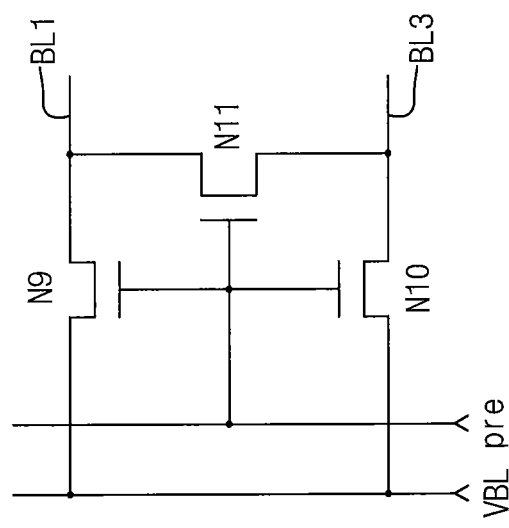

FIG. 8A is a diagram that illustrates a configuration of each of the precharge circuits PR1 and PR2 illustrated in FIGS. 4 and 6 according to example embodiments of the present inventive concept. Each of the precharge circuits PR1 and PR2 may include NMOS transistors N9 to N11.

In FIG. 8A, the NMOS transistors N9 and N10 may be turned on in response to the precharge control signal pre, and may precharge the bit lines BL1 and BL3 with the precharge voltage VBL. The NMOS transistor N11 may be turned on in response to the precharge control signal pre, and may equalize voltages of the bit lines BL1 and BL3.

FIG. 8B is a diagram that illustrates a configuration of the sense amplifier sa1 illustrated in each of FIGS. 4 and 6 according to example embodiments of the present inventive concept. The sense amplifier sa1 may include P-type metal-oxide-semiconductor (PMOS) transistors P1 and P2 and NMOS transistors N12 and N13.

In FIG. 8B, when a sense amplification voltage LA transitions from the precharge voltage VBL to the power voltage VDD and an inverted sense amplification voltage LAB transitions from the precharge voltage VBL to the ground voltage GND, the PMOS transistors P1 and P2 may be turned on in response to a "low" logic level of the bit line BL1 or BL2 and may amplify the bit line BL2 or BL1 to the power voltage VDD, and the NMOS transistors N12 and N13 may be turned on in response to a "high" level of the bit line BL1 or BL2 and may amplify the bit line BL2 or BL1 to the ground voltage GND.

Figure 9:
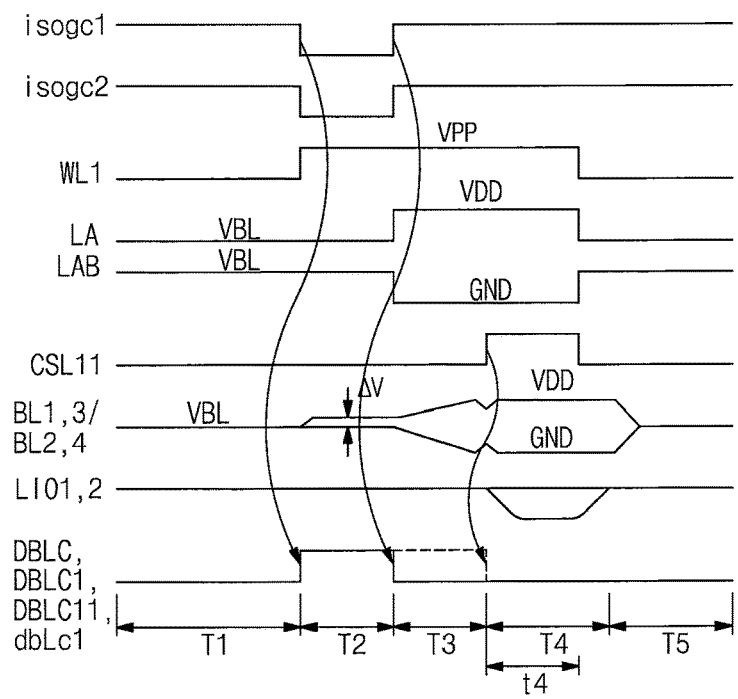
FIG. 9 is an operation waveform diagram that illustrates a write operation in a DRAM device according to example embodiments of the present inventive concept.

FIG. 9 is an operation waveform diagram that illustrates a write operation in DRAM devices according to example embodiments of the present inventive concept. FIG. 9 illustrates an operation in which data having a "high" logic level transmitted through the input and output line pairs LIO1 and LIO2 is written while data having the "high" logic level is stored in each of memory cells MC connected between the sub word line WL1 and the odd-numbered bit lines BL1 and BL3 among the memory cells MC of the sub block SMCA11 of the sub memory cell array block MCA11 illustrated in each of FIGS. 4 and 6.

Referring to FIGS. 1 to 6 and 9, in a period T1, the control signal generators 30-21 to 30-24 and 30-21' to 30-24' may generate the bit line isolation gate control signal ISOGC1 to ISOGC4 having "high" logic levels and the sense amplifier control signals SE1 to SE4 having "low" logic levels. The dummy bit line controllers 50, 50', and 50" may generate the dummy bit line control signals DBLC, DBLC1, DBLC2, DBLC11 to DBLC14, and DBLC21 to DBLC24 having the "low" logic levels. The control signal generators 30-21' to 30-24' may further generate the dummy bit line control signals DBLC1 to DBLC4 having the "low" logic levels, respectively. The control signal drivers CSD and CSD' in the conjunction regions CJ11 to CJ34 may respectively generate the first and second bit line isolation gate drive control signals isogc1 and isogc2 having the "high" logic levels, and generate a sense amplification voltage pair LA and LAB having a precharge voltage VBL. The control signal driver CSD' may further generate the dummy bit line drive control signal dblc1 having the "low" logic level. Therefore, all of the first and second bit line isolation gates ISOG1 and ISOG2 in the memory cell arrays 10 and 10' may be turned on, and all of the sense amplifiers sa1 and sa2 may be turned off. In this state, each of the precharge circuits PR1 and PR2 in the memory cell arrays 10 and 10' may be enabled in response to the precharge control signal pre so that all of the bit lines and all of the sense bit lines in the memory cell arrays 10 and 10' may be precharged with the precharge voltage VBL. All of the switches SW, SW1, SW2, SW11 to SW14, SW21 to SW24, and SW1' may be turned off so that the dummy bit lines in the X memory cell array blocks XBLK1 and XBLK4 may transition to a floating state. That is, in the period T1, a precharge operation may be performed. Referring to FIGS. 1 to 6 and 9, in a period T2, when an active command ACT is generated, the sub word line driver D1 in the sub word line driver region SWD11 may select the sub word line WL1 in response to the main word line selection signal NWE11 and the sub word line drive selection signal px11. The control signal generators 30-21 and 30-21' may generate the bit line isolation gate control signal ISOGC1 having a "low" logic level for a first predetermined period (i.e., the period T2) in response to the active command ACT and the Y block selection signal YB1. The control signal generator 30-21' may generate the dummy bit line control signal DBLC1 having a "high" logic level for the first predetermined period in response to the active command ACT and the X block selection signal XB1. The dummy bit line controllers 50, 50', and 50" may generate the dummy bit line control signals DBLC, DBLC1, and DBLC11 having the "high" logic level for the first predetermined period in response to the active command ACT and the X block selection signal XB1. The control signal drivers CSD and CSD' in the conjunction region CJ11 may generate the first and second bit line isolation gate drive control signals isogc1 and isogc2 having "low" logic levels in response to the X block selection signal XB1 and the bit line isolation gate control signal ISOGC1 having the "low" logic level. The control signal driver CSD' may further generate the dummy bit line drive control signal dblc1 having a "high" logic level. The dummy bit line control signals DBLC, DBLC1, and DBLC11 and the dummy bit line drive control signal dblc1 may be generated so as to be activated in response to the first or second bit line isolation drive control signal isogc1 or isogc2. The first and second bit line isolation gates ISOG1 and ISOG2 may be turned off, the odd-numbered bit lines BL1 and BL3 of the sub memory cell array block MCA11 may be isolated from the odd-numbered sense bit lines SBL1 and SBL3 of the sense amplification region SA11, and the even-numbered bit lines BL2 and BL4 of the sub memory cell array block MCA21 may be isolated from the even-numbered sense bit lines SBL2 and SBL4 of the sense amplification region SA11. The switches SW, SW1, SW11, and SW1' may be turned on in response to the dummy bit line control signals DBLC, DBLC1, and DBLC11 or the dummy bit line drive control signal dblc1, and may apply the precharge voltage VBL to the dummy bit lines DBL in the X memory cell array blocks XBLK1 and XBLK4, the X memory cell array block XBLK1, or the sub memory cell array block MCA11. When the sub word line WL1 is selected, a charge sharing operation may be performed between the capacitor C of each of the memory cells of the sub memory cell array block MCA11 connected to the selected sub word line WL1 and the corresponding odd-numbered bit lines BL1 and BL3. While the charge sharing operation is performed, when data having the "high" logic level is stored in the memory cell MC, a voltage of a corresponding bit line may be increased from the precharge voltage VBL by a voltage ΔV, and when data having the "low" logic level is stored in the memory cell MC, a voltage of a corresponding bit line may be decreased from the precharge voltage VBL by the voltage (e.g., ΔV). Therefore, in the DRAM devices according to the example embodiments of the present inventive concept, when the charge sharing operation is performed, the precharge voltage VBL is applied to the dummy bit lines DBL so that an increase of a threshold voltage of the access transistor AT of each of the memory cells connected to the selected sub word line WL1 may be suppressed, and, thus, the stability of the charge sharing operation may be improved. After the charge sharing operation is performed, the dummy bit line control signals DBLC, DBLC1, and DBLC11 and the dummy bit line drive control signal dblc1 having the "low" logic levels may be generated, and the switches SW, SW1, SW11, and SW1' may be turned off so that the dummy bit lines may transition to a floating state.

Referring to FIGS. 1 to 6 and 9, in a period T3, the control signal generators 30-21 and 30-21' may generate the bit line isolation gate control signal ISOGC1 having the "high" logic level and the sense amplifier control signal SE1 having a "high" logic level in response to the write command WR and the Y block selection signal YB1. The dummy bit line controllers 50, 50', and 50" may further maintain the dummy bit line control signals DBLC, DBLC1, and DBLC11 at the "high" logic level for a second predetermined period (e.g., the period T3, that is, a period until the corresponding column selection signal CSL11 having a "high" logic level is generated), as indicated by a dotted line in FIG. 9. The control signal generator 30-21' may also further maintain the dummy bit line control signal DBLC1 at the "high" logic level for the second predetermined period, as indicated by a dotted line in FIG. 9. The control signal drivers CSD and CSD' may generate the first and second bit line isolation gate drive control signals isogc1 and isogc2 having the "high" logic levels, and may generate a sense amplification voltage LA having a power voltage VDD and an inverted sense amplification voltage LAB having a ground voltage GND. The control signal driver CSD' may further maintain the dummy bit line drive control signal dblc1 at the "high" logic level for the second predetermined period. That is, the dummy bit line control signals DBLC, DBLC1, and DBLC11, and the dummy bit line drive control signal dblc1 may be activated in response to the first or second bit line isolation drive control signal isogc1 or isogc2, and be deactivated before the corresponding column selection signal is activated. The switches SW, SW1, SW11, and SW1' may be turned on, and may further apply the precharge voltage VBL to the dummy bit lines DBL in the X memory cell array blocks XBLK1 and XBLK4, the X memory cell array block XBLK1, or the sub memory cell array block MCA11 in the X memory cell array block XBLK1 for the second predetermined period. The odd-numbered bit lines BL1 and BL3 of the sub memory cell array block MCA11 may be connected to the odd-numbered sense bit lines SBL1 and SBL3 in the sense amplification region SA11, and the even-numbered bit lines BL2 and BL4 of the sub memory cell array block MCA21 may be connected to the even-numbered sense bit lines SBL2 and SBL4 in the sense amplification region SA11. The sense amplifiers sa1 and sa2 in the sense amplification region SA11 may be enabled, may amplify the data having the "high" logic level of the odd-numbered sense bit lines SBL1 and SBL3 and the even-numbered sense bit lines SBL2 and SBL4 in the sense amplification region SA11 to the power voltage VDD, and may amplify the data having the "low" logic level thereof to the ground voltage GND.

Referring to FIGS. 1 to 6 and 9, in a period T4, the control signal generators 30-21 and 30-21' may maintain the sense amplifier control signal SE1 at the "high" logic level. The column decoder 30-11 may generate the column selection signal CSL11 having the "high" logic level for a third predetermined period (e.g., a period t4). The NMOS transistors N5 to N8 of the input and output gates IOG1 and IOG2 of the sense amplification circuit SA1 may be turned on in response to the column selection signal CSL11, and may transmit the data having the "high" logic level and the inverted data having the "low" logic level through the input and output line pairs LIO1 and LIO2 to sense bit line pairs (SBL1 and SBL2) and (SBL3 and SBL4), respectively. Further, the sense amplifiers sa1 and sa2 of the sense amplification circuit SA1 may amplify the data having the "high" logic level transmitted to the sense bit line pairs (SBL1 and SBL2) and (SBL3 and SBL4), and may transmit the data having been amplified to the power voltage VDD to the odd-numbered bit lines BL1 and BL3. Accordingly, memory cells connected to the sub word line WL1 and the odd-numbered bit lines BL1 and BL3 of the sub block SMCA11 of the sub memory cell array block MCA11 may store the data having the "high" logic levels. The memory cells connected to the sub word line WL1 and the odd-numbered bit lines BL1 and BL3 of each of the sub blocks, excluding the sub block SMCA11 connected to the sub word line WL1 of the sub memory cell array block MCA11, may store the amplified data. The column decoder 30-11 may generate the column selection signal CSL11 having the "low" logic level. Accordingly, the sense bit lines (SBL1 and SBL2) and (SBL3 and SBL4) of the sense amplification circuit SA1 and the input and output line pairs LIO1 and LIO2 may be disconnected. Then, the sub word line driver D1 may not select the sub word line WL1. The control signal generators 30-21 and 30-21' may generate the sense amplifier control signal SE1 having the "low" logic level, and the control signal drivers CSD and CSD' may generate the sense amplification voltage pair LA and LAB having a precharge voltage VBL. Accordingly, the write operation may be completed.

In a period T5, all of the bit lines and all of the sense bit lines in the memory cell array 10 may be precharged with the precharge voltage VBL by performing the same operation as in the period T1.

Figure 10:
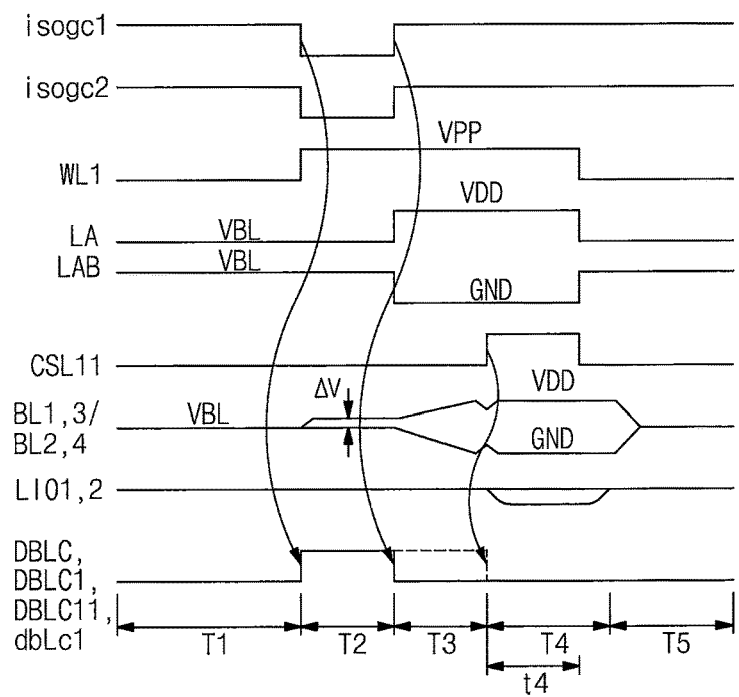
FIG. 10 is an operation waveform diagram that illustrates a read operation in a DRAM device according to example embodiments of the present inventive concept.

FIG. 10 is an operation waveform diagram that illustrates a read operation in DRAM devices according to example embodiments of the present inventive concept. FIG. 10 illustrates an operation in which the data having the "high" logic level stored in the memory cells MC connected between the sub word line WL1 and the odd-numbered bit lines BL1 and BL3 among the memory cells MC of the sub block MCA11 of the sub memory cell array block MCA11 illustrated in FIGS. 4 and 6 is read.

Referring to FIGS. 1 to 6 and 10, because operations in periods T1, T2, T3, and T5 are the same as those in FIG. 9, these operations may be understood with reference to the description of FIG. 9.

Referring to FIGS. 1 to 6 and 10, in a period T4, the control signal generators 30-21 and 30-21' may maintain the sense amplifier control signal SE1 at the "high" logic level. The column decoder 30-11 may generate the column selection signal CSL11 having the "high" logic level for a third predetermined period (e.g., a period t4). The NMOS transistors N5 to N8 of the input and output gates IOG1 and IOG2 of the sense amplification circuit SA1 may be turned on in response to the column selection signal CSL11, and may transmit the data having the power voltage VDD of the odd-numbered sense bit lines SBL1 and SBL3 and the data having the ground voltage GND of the even-numbered sense bit lines SBL2 and SBL4 amplified by the sense amplifiers sa1 and sa2 of the sense amplification circuit SA1 to the input and output line pairs LIO1 and LIO2. Accordingly, the data having the "high" logic level stored in the memory cells connected to the sub word line WL1 and the odd-numbered bit lines BL1 and BL3 of the sub block SMCA11 of the sub memory cell array block MCA11 may be read. The memory cells connected to the sub word line WL1 and the odd-numbered bit lines BL1 and BL3 of each of the sub blocks excluding the sub block SMCA11 connected to the sub word line WL1 of the sub memory cell array block MCA11 may store the amplified data. The column decoder 30-11 may generate the column selection signal CSL11 having the "low" logic level. Accordingly, the sense bit line pairs (SBL1 and SBL2) and (SBL3 and SBL4) of the sense amplification circuit SA1 and the input and output line pairs LIO1 and LIO2 are disconnected. Then, the sub word line driver D1 may not select the sub word line WL1. The control signal generators 30-21 and 30-21' may generate the sense amplifier control signal SE1 having the "low" logic level, and the control signal drivers CSD and CSD' may generate a sense amplification voltage pair LA and LAB having a precharge voltage VBL. Accordingly, the read operation may be completed.

In the above-described example embodiments of the present inventive concept, although the dummy bit lines DBL of the memory cell arrays 10 and 10' of the DRAM devices 100, 200, 300, and 400 are illustrated as being arranged in the X memory cell array blocks XBLK1 and XBLK4 arranged at both ends of and in the bit line direction Y, the dummy bit lines DBL may, in other embodiments, be arranged in outer sides the Y memory cell array blocks YBLK1 and YBLK4 arranged at both ends of and in the word line direction X. In these embodiments, when the precharge voltage VBL is applied to the dummy bit lines included in the X memory cell array blocks XBLK1 and XBLK4 arranged at both ends of and in the bit line direction Y, one of the X memory cell array blocks XBLK1 and XBLK4, and one of the sub memory cell array blocks MCA11 to MCA44, the precharge voltage VBL may also be applied to the dummy bit lines arranged on the outer side of the Y memory cell array blocks YBLK1 and YBLK4 arranged at both ends of and in the word line direction X.

In the above-described example embodiments of the present inventive concept, although the memory cell arrays 10 and 10' of the DRAM devices 100, 200, 300, and 400 are illustrated as a configuration including four X memory cell array blocks XBLK1 to XBLK4 and four Y memory cell array blocks YBLK1 to YBLK4, in other embodiments the memory cell arrays 10 and 10' may include five or more X memory cell array blocks and five or more Y memory cell array blocks. Further, in the above-described example embodiments of the present inventive concept, although the memory cell arrays 10 and 10' are illustrated as a configuration including two input and output line pairs LIO1 and LIO2, in other embodiments the memory cell arrays 10 and 10' may include three or more input and output line pairs. Additionally, although the control signal generators 30-21 to 30-24 and 30-21' to 30-24' of the DRAM devices 100, 200, 300, and 400 are illustrated as arranged outside the memory cell arrays 10 and 10', in other embodiments the control signal generators may be arranged in corresponding conjunction regions. For example, the control signal generators 30-21 and 30-21' may be arranged in the conjunction regions CJ11, CJ21, and CJ31.

In the above-described example embodiments of the present inventive concept, although it is described that, while the write operation and the read operation of the DRAM device are performed, the precharge voltage is applied to the dummy bit lines for the first predetermined period in which the charge sharing operation is performed or the precharge voltage is further applied to the dummy bit lines for a time obtained by adding, to the first predetermined period, the second predetermined period, which is a period until the corresponding column selection signal is activated after the first predetermined period, in other embodiments the charge sharing operation may be performed in a refresh operation, and, in these embodiments, the precharge voltage may be applied to the dummy bit lines.

According to example embodiments of the present inventive concept, the DRAM device can apply the precharge voltage to the dummy bit lines in the memory cell array block, including the selected sub word line, while the charge sharing operation is performed on the memory cells connected to the selected sub word line, and, thus, an increase of a threshold voltage of the access transistor of each of the memory cells connected to the selected word line can be suppressed. Therefore, failures that that may be caused by the access transistor not being completely turned on can be reduced or prevented.

While the embodiments of the present inventive concept have been described with reference to the accompanying drawings, it should be understood by those skilled in the art that various modifications may be made without departing from the scope of the present inventive concept and without changing essential features. Therefore, the above-described embodiments should be considered in a descriptive sense only and not for purposes of limitation.

What is claimed is:

1. A dynamic random access memory (DRAM) device comprising:
   a memory cell array comprising:
   a first sub memory cell array block comprising a plurality of first memory cells between a plurality of first sub word lines and a plurality of first odd-numbered bit lines and a plurality of dummy bit lines; and
   a second sub memory cell array block including a plurality of second memory cells between a plurality of second sub word lines and a plurality of second odd-numbered bit lines and a plurality of second even-numbered bit lines,
   wherein the memory cell array has an open bit line architecture in which the plurality of first odd-numbered bit lines and the plurality of second even-numbered bit lines form bit line pairs, and
   wherein, responsive to selection of one of the plurality of first sub word lines, a predetermined voltage is applied to the plurality of dummy bit lines for a first predetermined period in which a charge sharing operation is performed on the plurality of first memory cells connected to the selected one of the plurality of first sub word lines.

2. The DRAM device of claim 1, wherein the predetermined voltage is a precharge voltage for pre-charging the plurality of first odd-numbered bit lines, the plurality of second odd-numbered bit lines, and the plurality of second even-numbered bit lines excluding the plurality of dummy bit lines while a precharge operation is performed.

3. The DRAM device of claim 1, further comprising:
   a first bit line isolation gate configured to isolate the plurality of first odd-numbered bit lines from odd-numbered sense bit lines in response to a first bit line isolation gate control signal;
   a second bit line isolation gate configured to isolate the plurality of second even-numbered bit lines from even-numbered sense bit lines in response to a second bit line isolation gate control signal;
   precharge circuits configured to precharge the odd-numbered sense bit lines and the even-numbered sense bit lines with a precharge voltage in response to a precharge control signal;
   sense amplifiers configured to amplify data of the odd-numbered sense bit lines and data of the even-numbered sense bit lines in response to a sense amplification voltage pair; and
   input and output gates configured to transmit data between the odd-numbered sense bit lines and the even-numbered sense bit lines, and input and output line pairs, in response to a corresponding column selection signal.

4. The DRAM device of claim 3, wherein the first predetermined period is a period in which the first bit line isolation gate control signal or the second bit line isolation gate control signal is deactivated.

5. The DRAM device of claim 3, wherein the plurality of dummy bit lines have a floating state for a time other than the first predetermined period.

6. The DRAM device of claim 3, wherein the DRAM device applies the predetermined voltage for a third predetermined period obtained by adding, to the first predetermined period, a second predetermined period which is a period until the column selection signal is activated after the first predetermined period.

7. The DRAM device of claim 6, wherein the plurality of dummy bit lines have a floating state for a fourth predetermined period other than the third predetermined period.

8. A dynamic random access memory (DRAM) device comprising a memory cell array comprising a plurality of X memory cell array blocks, wherein each of the plurality of X memory cell array blocks comprises a plurality of sub memory cell array blocks, each of the plurality of sub memory cell array blocks comprises a plurality of memory cells arranged between a plurality of sub word lines, a plurality of odd-numbered bit lines, and a plurality of even-numbered bit lines, the memory cell array having an open bit line architecture in which the even-numbered bit lines of a first block of the plurality of sub memory cell array blocks and the odd-numbered bit lines of a second block of the plurality of sub memory cell array blocks, which are arranged adjacent to each other, are arranged to form bit line pairs, and the even-numbered bit lines or the odd-numbered bit lines of the sub memory cell array blocks included in first and second X memory cell array blocks arranged at both ends of the plurality of X memory cell array blocks are dummy bit lines,
   wherein, responsive to selection of one sub word line of the plurality of sub word lines of the sub memory cell array blocks included in the first and second X memory cell array blocks, a predetermined voltage is applied to the dummy bit lines in the sub memory cell array block including the one selected sub word line for a first predetermined period in which a charge sharing operation is performed on memory cells of the plurality of memory cells connected to the one selected sub word line.

9. The DRAM device of claim 8, wherein the DRAM device is further configured to apply the predetermined voltage to, among the first and second X memory cell array blocks, the dummy bit lines of the X memory cell array block including the one selected sub word line for the first predetermined period, and
   the DRAM device further comprises:
   a dummy bit line controller configured to generate first and second dummy bit line control signals, which are activated for the first predetermined period, in response to an active command and X block selection signals for selecting the first and second X memory cell array blocks, respectively; and
   first and second switches configured to apply the predetermined voltage to the dummy bit lines included in each of the first and second X memory cell array blocks in response to each of the first and second dummy bit line control signals, respectively.

10. The DRAM device of claim 8, wherein the DRAM device is further configured to apply the predetermined voltage to the dummy bit lines in the first and second X memory cell array blocks for the first predetermined period, and
   the DRAM device further comprises:
   a dummy bit line controller configured to generate a dummy bit line control signal, which is activated for the first predetermined period, in response to an active command and one of X block selection signals for selecting the first and second X memory cell array blocks; and
a switch configured to apply the predetermined voltage to the dummy bit lines included in the first and second X memory cell array blocks in response to the dummy bit line control signal.

11. The DRAM device of claim 8, wherein the plurality of sub memory cell array blocks included in the plurality of X memory cell array blocks constitute a plurality of Y memory cell array blocks.

12. The DRAM device of claim 11, further comprising:
a dummy bit line controller configured to generate a plurality of dummy bit line control signals, which are activated for the first predetermined period, by combining X block selection signals for selecting the first and second X memory cell array blocks and Y block selection signals for selecting the plurality of Y memory cell array blocks in response to an active command; and
a plurality of switches configured to apply the predetermined voltage to the dummy bit lines included in each of the sub memory cell array blocks of the first and second X memory cell array blocks in response to each of the plurality of dummy bit line control signals.

13. The DRAM device of claim 11, further comprising:
a first row decoder configured to, among n bits of a row address, decode a first predetermined number of bits of the row address in response to an active command and a corresponding X block signal, and generate a plurality of main word line selection signals;
a second row decoder configured to decode, among the n bits of the row address, a second predetermined number of bits of the row address in response to the active command, the corresponding X block selection signal, and/or an X block selection signal adjacent to the corresponding X block selection signal, and generate a plurality of sub word line selection signals;
a column decoder configured to decode, among m bits of a column addresses, a third predetermined number of bits of the column address in response to a read command or a write command and a corresponding Y block selection signal, and generate a plurality of column selection signals; and
a control signal generator configured to generate a bit line isolation gate control signal in response to the active command and the corresponding Y block selection signal, and generate a sense amplifier control signal in response to the read command or the write command and the corresponding Y block selection signal.

14. The DRAM device of claim 11, wherein the predetermined voltage is a precharge voltage for pre-charging the plurality of odd-numbered bit lines and the plurality of even-numbered bit lines excluding the dummy bit lines while a precharge operation is performed.

15. The DRAM device of claim 11, wherein the sub memory cell array blocks comprises a plurality of sub blocks, each of the plurality of sub blocks comprising a predetermined number of one of the plurality of memory cells connected between the plurality of sub word lines, and the even-numbered bit lines and the odd-numbered bit lines, and
the memory cell array further comprises:
a sense amplification region between the sub memory cell array blocks, which are adjacent to each other in a bit line direction;
a sub word line driver region between the sub memory cell array blocks, which are adjacent to each other in a word line direction; and
a conjunction region at an intersection of the sense amplification region and the sub word line driver region.

16. The DRAM device of claim 15, wherein the sub word line driver region comprises a sub word line driver configured to select, among the sub word lines of a respective one of the sub memory cell array blocks, a corresponding sub word line by combining a corresponding main word line selection signal and each of sub word line drive selection signals,
the conjunction region comprises:
a sub word line selection signal driver configured to drive the sub word line selection signals in response to a corresponding Y block selection signal, and to generate the sub word line drive selection signals; and
a control signal driver configured to drive a bit line isolation gate control signal in response to a corresponding X block selection signal or a X block selection signal adjacent to the corresponding X block selection signal, to generate a first bit line isolation gate drive control signal and a second bit line isolation gate drive control signal, and to generate a sense amplification voltage pair in response to a sense amplifier control signal, and
the sense amplification region comprises a sense amplification circuit configured to amplify data of an odd-numbered sense bit lines and data of an even-numbered sense bit lines in response to the sense amplification voltage pair.

17. The DRAM device of claim 16, wherein the sense amplification circuit comprises:
a first bit line isolation gate turned on in response to the first bit line isolation gate drive control signal and configured to connect the even-numbered bit lines of the first block of the sub memory cell array blocks adjacent to each other in the bit line direction to the even-numbered sense bit lines;
a second bit line isolation gate turned on in response to the second bit line isolation gate drive control signal and configured to connect the odd-numbered bit lines of the second block of the sub memory cell array blocks adjacent to each other in the bit line direction to the odd-numbered sense bit lines;
precharge circuits configured to precharge the odd-numbered sense bit lines and the even-numbered sense bit lines with a precharge voltage in response to a precharge control signal;
sense amplifiers configured to amplify data of the odd-numbered sense bit lines and data of the even-numbered sense bit lines in response to the sense amplification voltage pair; and
input and output gates configured to transmit data between the odd-numbered sense bit lines and the even-numbered sense bit lines, and input and output line pairs, in response to a corresponding column selection signal.

18. The DRAM device of claim 17, wherein the first predetermined period is a period in which the first bit line isolation gate control signal or the second bit line isolation gate control signal is deactivated.

19. The DRAM device of claim 17, wherein the plurality of dummy bit lines have a floating state for a fourth predetermined period other than the first predetermined period.

20. The DRAM device of claim 17, wherein:
a control signal generator is further configured to generate a dummy bit line control signal in response to an active command, the corresponding Y block selection signal, and one of the X block selection signals for selecting first and second X memory cell array blocks;
the control signal driver is further configured to generate a dummy bit line drive control signal in response to the dummy bit line control signal; and
the sense amplification region further includes a switch turned on in response to the dummy bit line drive control signal and configured to apply the predetermined voltage to the dummy bit lines in the respective one of the plurality of sub memory cell array blocks.

* * * * *